(12) United States Patent
Fung et al.

(10) Patent No.: US 6,285,960 B1
(45) Date of Patent: Sep. 4, 2001

(54) METHOD AND APPARATUS FOR A ROUTER LINE CARD WITH ADAPTIVE SELECTABLE GAIN CONTROL

(75) Inventors: Joseph C. H. Fung, San Jose; Mark E. Millet, Mountain View; Charles J. Naegeli, Montara; Nan Tu, San Jose; Guenter Roeck, San Jose; Yuzon Hao, San Jose, all of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/167,775

(22) Filed: Oct. 7, 1998

(51) Int. Cl.[7] ........................................... H04M 1/24
(52) U.S. Cl. ..................... 702/107; 702/121; 702/122; 379/1; 379/29; 370/395; 370/465; 375/224; 375/345
(58) Field of Search ........................... 702/107, 120, 702/122, 57, 85, 126, 189; 370/395, 465, 241; 375/224, 345; 709/220, 221, 222, 249; 379/1, 10, 29, 31, 28; 324/601

(56) References Cited

U.S. PATENT DOCUMENTS 5,003,554 * 3/1991 Chism ................................. 375/224
5,005,197 * 4/1991 Parsons et al. ........................ 379/21
5,974,363 * 10/1999 Gammel et al. ...................... 702/117

* cited by examiner

*Primary Examiner*—Marc S. Hoff
*Assistant Examiner*—Hien Vo
(74) *Attorney, Agent, or Firm*—Beyer Weaver & Thomas LLP

(57) ABSTRACT

A system and method are disclosed for calibrating a line card having a gain control circuit and memory device. The gain control circuit is configured to receive an input signal and an adjustment signal and to output an adjusted output signal that is based on the input signal and the adjustment signal. The gain control circuit also is configured to alter the adjustment signal to a nominal adjustment value so that an adjusted amplitude value of the adjusted signal converges with a nominal amplitude value. A first input signal, a first adjustment signal, and a nominal amplitude value are provided to the gain control circuit. A first nominal adjustment value is determined. The first nominal adjustment value is substantially permanently stored within a first address of the memory device with the first address being associated with the first input signal.

29 Claims, 5 Drawing Sheets

METHOD AND APPARATUS FOR A ROUTER LINE CARD WITH ADAPTIVE SELECTABLE GAIN CONTROL

BACKGROUND OF THE INVENTION

1. Field of the Invention

The present invention relates generally to methods and apparatus for calibrating a line card that is configured to be used within a network router. More specifically, the present invention relates to controlling gain adjustment on a line card that includes a gain control circuit.

2. Description of the Related Art

Network routers typically include one or more line cards, and each line card provides an interface between networks that implement different types of data formats. For example, a cable line card is configured to provide an interface between a cable network and a digital network, such as an ATM network. The cable network has data that is encoded within RF modulated signals, while the digital network has data that is encoded within digital signals, such as data packets.

One of the main functions of a conventional line card is to convert one type of data signal into another type of data signal so that two different types of networks may communicate with each other. For example, a cable line card converts modulated RF signals into data packets and vice versa. That is, the data is extracted from a modulated RF signal and formatted into one or more data packets, and data is extracted from data packets and formatted into a modulated RF signal.

However, before the line card can extract data from a modulated RF signal that is input to the line card, the line card is typically configured to amplify the RF signal so that it is strong enough to be processed by the line card's components. That is, the RF signal is amplified such that the line card's internal data processing circuits may properly analyze the RF signal. For example, an analog to digital converter that is configured to convert the RF signal into appropriate digital values requires an RF signal with an amplitude that results in an acceptable range of detectable voltage levels for the RF signal.

Accordingly, conventional RF line cards typically include a gain control circuit for amplifying the RF signal. Each line card is typically calibrated for a given amplitude input prior to installation of each line card into a router. The gain control circuit is used to determine an adjustment value for controlling amplification of a particular input signal to the line card. This adjustment value is then applied to the line card as a fixed adjustment signal for controlling amplification of the particular input signal.

Each line card must be calibrated since each line card's components may perform differently due to small manufacturing variances between separate line cards. That is, the varying characteristics of the components of each line card contribute to how much the input signal is amplified and may result in a different amplification requirement for the input signal for each line card, even though the input signal is identical for each card.

A conventional calibration procedure includes providing an initial adjustment signal to the gain control circuit of the line card. The gain control circuit adjusts the input signal's amplitude based on the initial adjustment signal. This initial adjustment signal is typically set manually while an input signal with a particular amplitude level is input to the line card. The gain control circuit adjusts the amplitude of the input signal according to the initial adjustment signal and outputs an adjusted output signal. The adjusted output signal is analyzed to determine whether it is at an acceptable level. If the adjusted output signal is not at the acceptable level, the initial adjustment signal is altered based on whether the adjusted output signal is too low or too high. If the adjusted output signal is at or near the acceptable level, the current adjustment signal is then fixed and continuously used to adjust any input signal's amplitude that is thereafter received by the line card.

Although conventional calibration techniques for calibrating line cards provide an adequate way to calibrate differing line cards for a known input amplitude, the above described techniques have several disadvantages. Since the adjustment signal is fixed for a known input amplitude during calibration, other input amplitudes may not be used once the line card has been calibrated. That is, once the line card has been calibrated, a user must provide an RF signal having a particular input amplitude to the line card. For example, a 0 dBmV (defined as 1 mV at 75 ohms) RF input signal may be required for proper performance of the calibrated line card.

As a result of these rigid RF input signal requirements, the user may have to amplify or attenuate the RF input signal prior to inputting it to the line card. Thus, the user may have to implement special hardware to meet the input signal requirements. Additionally, each time the system hardware changes (e.g., new cable lines are laid to reach newly built communities), different special hardware is needed for amplifying or attenuating the RF input signal to acceptable levels. In sum, the conventional calibration techniques of providing a fixed adjustment value for a known input amplitude results in the use of significant amounts of additional hardware and corresponding design time.

In view of the foregoing, there is a need for methods and apparatus for calibrating line cards that are flexible and allow a plurality of input amplitudes. Specifically, there is a need for flexible calibration methods and apparatus that do not require significant amounts of hardware redesign and/or development time when the input signal's amplitude changes or the line card is replaced with a different line card.

SUMMARY OF THE INVENTION

Accordingly, the present invention provides an apparatus and method for automatically calibrating a particular line card. In general terms, one or more nominal adjustment values are stored on each line card. Each nominal adjustment value is associated with a particular input signal and may be input as an adjustment signal to the line card in order to provide optimum gain control for the associated input signal if it is input to the line card. For example, a different nominal adjustment value may be stored for input signals of 0 dBmV, +8 dBmV, and −8 dBmV (1 dBmV means that the input signal is equivalent to 1 milivolt at 75 ohms).

One or more stored nominal adjustment value(s) may then be retrieved from the line card and used to select and input the adjustment signal to the line card. In one embodiment, one of the nominal value(s) may be retrieved and directly input as the adjustment signal. For example, the nominal value for 0 dBmV may be retrieved and then input as the adjustment signal. Alternatively, two or more stored nominal adjustment values may be retrieved and used to calculate the adjustment value. For example, the retrieved nominal adjustment values may be used to extrapolate or interpolate other adjustment values that are not stored as nominal adjustment values in the line card.

In one embodiment, a method for calibrating a line card having a gain control circuit and memory device is disclosed. The gain control circuit is configured to receive an input signal and an adjustment signal and to output an adjusted output signal that is based on the input signal and the adjustment signal. The gain control circuit also is configured to alter the adjustment signal to a nominal adjustment value so that an adjusted amplitude value of the adjusted signal converges with a nominal amplitude value.

A first input signal, a first adjustment signal, and a nominal amplitude value are provided to the gain control circuit. A first nominal adjustment value is determined. The first nominal adjustment value is substantially permanently stored within a first address of the memory device with the first address being associated with the first input signal.

In another embodiment, a first nominal adjustment value is retrieved that is associated with a first input signal, and a first adjustment signal is provided to the gain control circuit based on the first nominal adjustment value. In an alternative embodiment, the first nominal adjustment value is provided as the first adjustment signal. In yet another embodiment, a second nominal adjustment value is retrieved for a second input signal, and a third nominal adjustment value is calculated for a third input signal based on the first and second nominal adjustment values. The calculated third nominal adjustment value is provided as a third adjustment signal to the gain control circuit.

A computer readable medium containing program instructions for calibrating a line card having a gain control circuit and memory device is also disclosed. The computer readable medium includes computer readable code for (i) providing a first input signal to the gain control circuit, (ii) providing a first adjustment signal to the gain control circuit, (iii) providing a nominal amplitude value, (iv) determining a first nominal adjustment value, and (v) substantially permanently storing the first nominal adjustment value within a first address of the memory device. The first address is associated with the first input signal. The computer readable medium further includes a computer readable medium that stores the computer codes.

A computer system for calibrating a line card having a gain control circuit and memory device is also disclosed. The computer system includes an initializer mechanism arranged to provide a first input signal, a first adjustment signal, and a nominal amplitude value to the gain control circuit and a determination mechanism arranged to determine a first nominal adjustment value and to substantially permanently store the first nominal adjustment value within a first address of the memory device, wherein the first address is associated with the first input signal.

In another computer readable medium aspect, the computer readable medium includes computer readable code for (i) retrieving a first nominal adjustment value that is associated with a first input signal the memory device, and (ii) providing a first adjustment signal to the gain control circuit based on the first nominal adjustment value. A computer readable medium that stores the computer codes is also included.

In another computer system aspect, a computer system includes an extracting mechanism for retrieving a first nominal adjustment value that is associated with a first input signal the memory device and an analyzing mechanism for providing a first adjustment signal to the gain control circuit based on the first nominal adjustment value.

These and other features and advantages of the present invention will be presented in more detail in the following specification of the invention and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
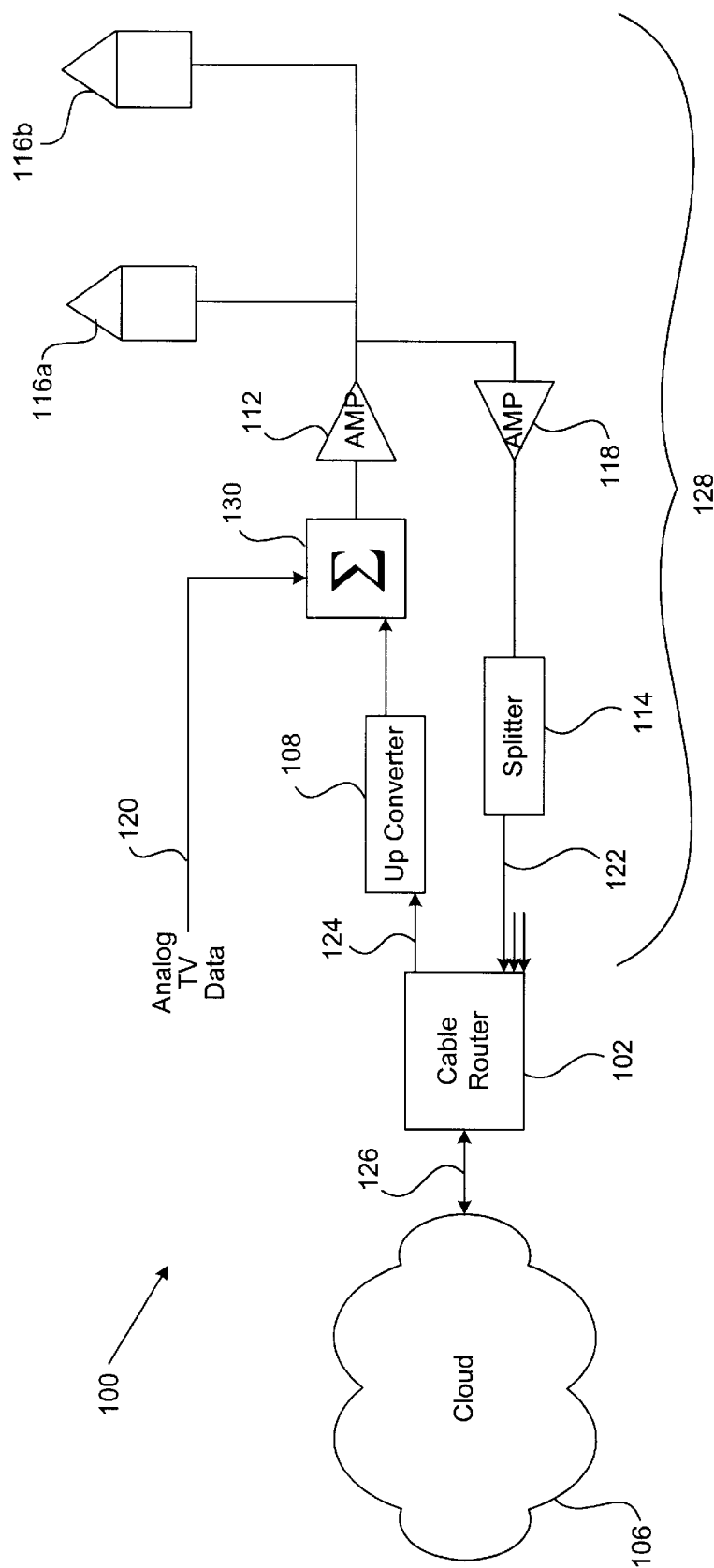
FIG. 1 is a diagrammatic representation of a cable television network for implementing the present invention in accordance with one embodiment of the present invention.

The present invention may be implemented within any type of network that requires gain control. For example, a cable television network typically requires gain control prior to extracting and processing data from a modulated RF (radio frequency) signal. FIG. 1 is a diagrammatic representation of a cable television network 100 for implementing the present invention in accordance with one embodiment of the present invention.

As shown, the cable network 100 may include a digital network portion 106 (sometimes referred to as a cloud), a cable network portion 128, and a cable router 102 for interfacing between the two network portions. The cable router 102 transmits and receives digital data to and from the digital network portion 106 via bus 126. Likewise, the cable router 102 receives modulated RF signals from the cable network portion 128 via upstream input lines 122 and coverts digital data into modulated intermediate frequency (IF) signals that are output on downstream line 124.

Referring first to the downstream side of the cable network portion 128, the router 102 receives digital data from the digital network portion 106 that is then modulated and converted into modulated IF signals. The router 102 then sends the modulated IF signals to an up-converter 108 that generates and outputs modulated RF signals. Analog TV signals 120 may also be added to the modulated RF signals by an adder block 130. The modulated RF signals are then typically converted into optical signals by amplifier block 112. The optical signals eventually are converted into electrical signals that then go to a plurality of cable subscribers 116. The electrical signals are received by the subscribers' cable modems that are connected to home PCs, for example.

Referring next to the upstream side of the cable network portion 128, subscriber data is sent from a particular subscriber 116a from the subscriber's PC and through their cable modem. The subscriber data is eventually converted to a modulated RF signal by amplifier 118, for example, and the modulated RF signal is input to the receiver as input signal 122. The cable network portion 128 may also include a splitter 114 for routing the subscriber data to other components besides the cable router 102.

There are a number of factors that may affect the input signal's amplitude level. However, most of these factors are directly related to the physical configuration of the cable network portion 128. For example, the amplitude level of the input signal is affected by the amount of cable wiring and components that are laid down for all subscribers 116, as well as the amount of load that is connected to the splitter 114. Thus, once the cable network portion 128 is set up, the amplitude level of the input signal is known and may be used to program the router 102, for example, to automatically calibrate each cable line card that is installed. Several embodiments of calibration procedures are described below.

The preceding description of the cable TV network 100 is merely illustrative and not meant to restrict the scope of the invention. For example, the diagram of FIG. 1 does not contain every necessary component for a cable TV network 100 so as not to obscure the invention. By way of a specific example, some type of converter is required to convert the optical signals into electrical signals and vice versa. Additionally, the present invention may be implemented in other types of networks (besides cable networks) or other types of cable network configurations.

Figure 2:
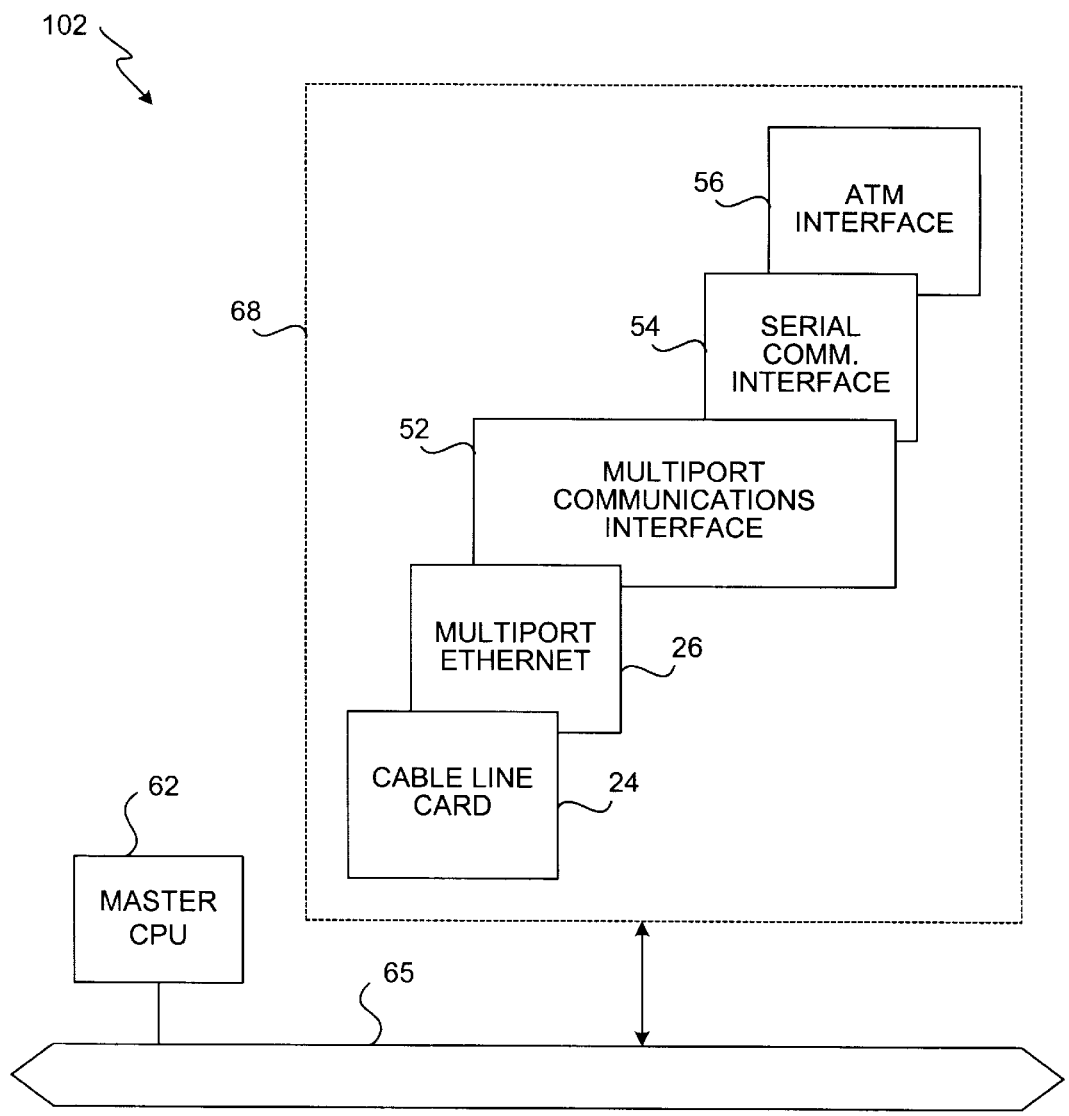
FIG. 2 is a diagrammatic representation of the router of FIG. 1 for implementing the present invention in accordance with one embodiment of the present invention.

FIG. 2 is a diagrammatic representation of the router 102 of FIG. 1 for implementing the present invention in accordance with one embodiment of the present invention. As shown, a router 102 of the present invention includes a master central processing unit (CPU) 62 and interfaces 68. These interfaces may be either high or low speed interfaces.

In some embodiments, the CPU 62 is responsible for such router tasks as routing table computations and network management. It may include one or more microprocessor chips selected from complex instruction set computer (CISC) chips, reduced instruction set computer (RISC) chips, or other available chips. In an alternative embodiment, non-volatile RAM and/or ROM also form part of CPU 62. However, there are many different ways in which memory could be coupled to the system.

The interfaces 68 are typically provided as interface cards. Generally, they control the sending and receipt of data over the network and sometimes support other peripherals used with the router 102. The interfaces 68 include a multiport communications interface 52, a serial communications interfaces 54, an asynchronous transfer mode (ATM) interface 56, a multiport ethernet interface 26, and a cable line card 24. Preferably, each of these interfaces (low/medium and high speed) includes (1) a plurality of ports appropriate for communication with the appropriate media, and (2) an independent processor and in some instances (3) RAM. The independent processors control such communications intensive tasks as packet switching and filtering, and media control and management. By providing separate processors for the communications intensive tasks, this architecture permits the master microprocessor 62 to efficiently perform routing computations, network diagnostics, security functions, etc.

Low and medium speed interfaces are coupled to the master CPU 62 through a data, control, and address bus 65. High speed interfaces 12 may be connected to the bus 65 through a fast data, control, and address bus (not shown) which is in turn connected to a bus controller (not shown). The bus controller functions are provided by a processor.

Although the system shown in FIG. 2 is a preferred router of the present invention, it is by no means the only router architecture on which the present invention may be implemented. For example, an architecture having a single processor that handles communications as well as routing computations, etc. would also be acceptable. Further, other types of interfaces and media could also be used with the router.

Figure 3:
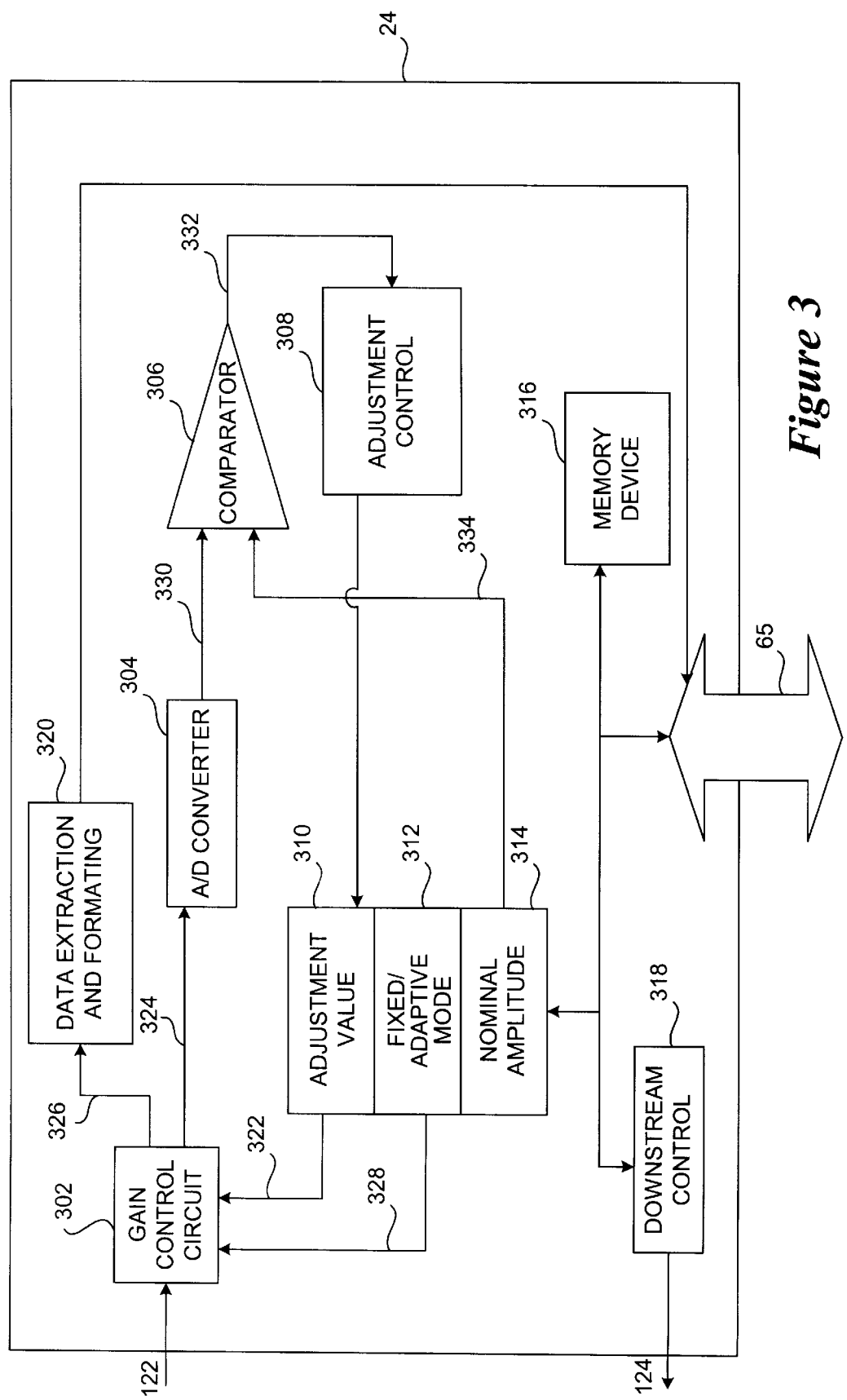
FIG. 3 is a diagrammatic representation of the line card of FIG. 2 for implementing the present invention in accordance with one embodiment of the present invention.

The present invention may be implemented on any type of line card that requires gain control. By way of example, FIG. 3 is a diagrammatic representation of the line card 24 of FIG. 2 for implementing the present invention in accordance with one embodiment of the present invention. As shown, the line card 24 is configured to receive upstream data in the form of a modulated RF input signal 122 (or an IF input signal). The line card 24 is also configured to output downstream data in the form of a modulated RF output signal 124.

The line card 24 includes a downstream control block 318 that is configured to receive digital data from bus 65, process the digital data, and convert it into a modulated RF output signal 124. For example, video data is received by the router and transmitted by bus 65 to the cable line card 24. The downstream control block 318 of cable line card 24 processes the video data and outputs downstream data as modulated RF output signal 124.

The line card may include any suitable type of adjustable gain control circuit for controlling and setting an amplitude of an input signal. By way of example, the line card 24 is configured with the following components for controlling the amplitude of the input signal 122: a gain control circuit 302, an analog to digital converter (A/D) 304, a comparator 306, a adjustment control block 308, an adjustment value register 310, a fixed/adaptive mode register 312, and an nominal amplitude register 314.

The gain control circuit 302 is configured to receive input signal 122 and an adjustment signal 322. The line card 24 may also include component(s) (not shown) for converting the adjustment signal 322 from a digital signal into an analog adjustment signal that is then received by the gain control circuit 302. Alternatively the gain control circuit 302 may be arranged to receive the adjustment signal 322 as a digital signal.

The gain control circuit 302 is also arranged to amplify the input signal 122 based on the adjustment signal 322. The adjustment signal 322 is based on the contents of the adjustment value register 310. By way of example, the adjustment value register 310 may contain binary data that indicates how much to amplify the received input signal 122. The gain control circuit 302 receives input signal 122, adjusts the input signal's amplitude based on adjustment signal 322, and outputs an adjusted output signal 324.

The A/D converter 304 is configured to convert the adjusted output signal 324 to a digital signal 330 based on the adjusted output signal's amplitude. The A/D converter 304 outputs the digital signal 330 to the comparator 306. The comparator 306 is configured to receive the digital signal 330 and compare it to a nominal amplitude signal 334 that is based on the contents of the nominal amplitude register 314. The comparator 332 then outputs a comparison signal 332 that indicates whether the digital signal 330 (or adjusted output signal) has a higher or lower value than the nominal amplitude signal 334. Of course, the A/D converter 304 may not be required if, for example, the comparator 332 is configured to compare voltage levels, instead of digital data. Of course, a digital to analog converter is then required to convert the nominal amplitude signal 334 from a digital signal into an analog signal.

The adjustment control block 308 is configured to receive the comparison signal 332 and decrement or increment the contents of the adjustment value register 310 based on the comparison signal. In other words, the contents of the adjustment value register 310 are adjusted such that a new adjustment signal 322 is input to the gain control circuit 302. Thus, the gain control circuit 302 either increases or decreases the amplification of the input signal 122 based on whether the previously adjusted output signal 324 from the gain control circuit 302 was too high or too low.

The line card 24 may be configured to operate in fixed or adaptive mode. Adaptive mode is utilized to calibrate the line card 24. As described above, the nominal amplification of input signal 122 is found by varying the adjustment value 310 until the adjusted output signal 324 that is output by the gain control circuit 302 converges with the nominal amplitude value when a nominal amplitude signal is provided as input signal 122. In other words, during adaptive mode, the line card 24 utilizes adjusting components to find a nominal adjustment value 310 that causes the output of A/D 304 to equal the output of the nominal amplitude register 314 when a nominal value for input signal 122 is provided.

In contrast to the adaptive mode, which may be used to determine a nominal adjustment value, the line card may be set to a fixed mode. Some of the gain control components are configured to be disabled when a fixed mode is selected for the line card 24 so that the input signal is amplified based on a previously determined stored value for adjustment signal 322. For example, the gain control circuit 302 may inhibit output of the adjusted output signal 324 to the A/D converter 304 when the contents of the fixed/adaptive mode register 312 indicate that the line card is in fixed mode. Instead, the adjusted output signal is output to line 326 to a data extraction and formatting block 320 that outputs digital data to bus 65. In sum, when the line card 24 is in fixed mode, the input signal 122 is amplified based on the contents of the adjustment value register 310, and the contents of the adjustment value register 310 are not altered by the adjustment control block 308. This value stored in the adjustment register 310 may be previously determined by using the adaptive mode.

Bus 65 may be utilized to access various components on the line card 24. Specifically, bus 65 may be used to access various memory devices on the line card 24. The present invention may utilize these memory devices to automatically calibrate the line card 24 and determine nominal adjustment values for particular input signal amplitudes. For example, the CPU and associated memory of a router may be programmed to automatically read and write to particular registers and/or memory devices on the line card 24. Alternatively, a CPU and associated memory that is integrated into a personal computer or work station may be programmed to automatically calibrate the line card 24. Of course, the present invention may be implemented any number of ways to automatically calibrate line card 24.

In general terms, the line card 24 is put into adaptive mode so that a nominal adjustment value for the adjustment signal may be found for a particular input signal's nominal amplitude level. The nominal adjustment value is stored in a particular address of the memory device 316. The particular address corresponds to the particular input signal's amplitude level. A plurality of nominal adjustment values may be determined and stored for a plurality of different input signal's nominal amplitude levels. These stored nominal adjustment values may then be accessed and used to provide a nominal adjustment signal that is appropriate for both a particular input signal's amplitude level and the particular line card 24.

Figure 4:
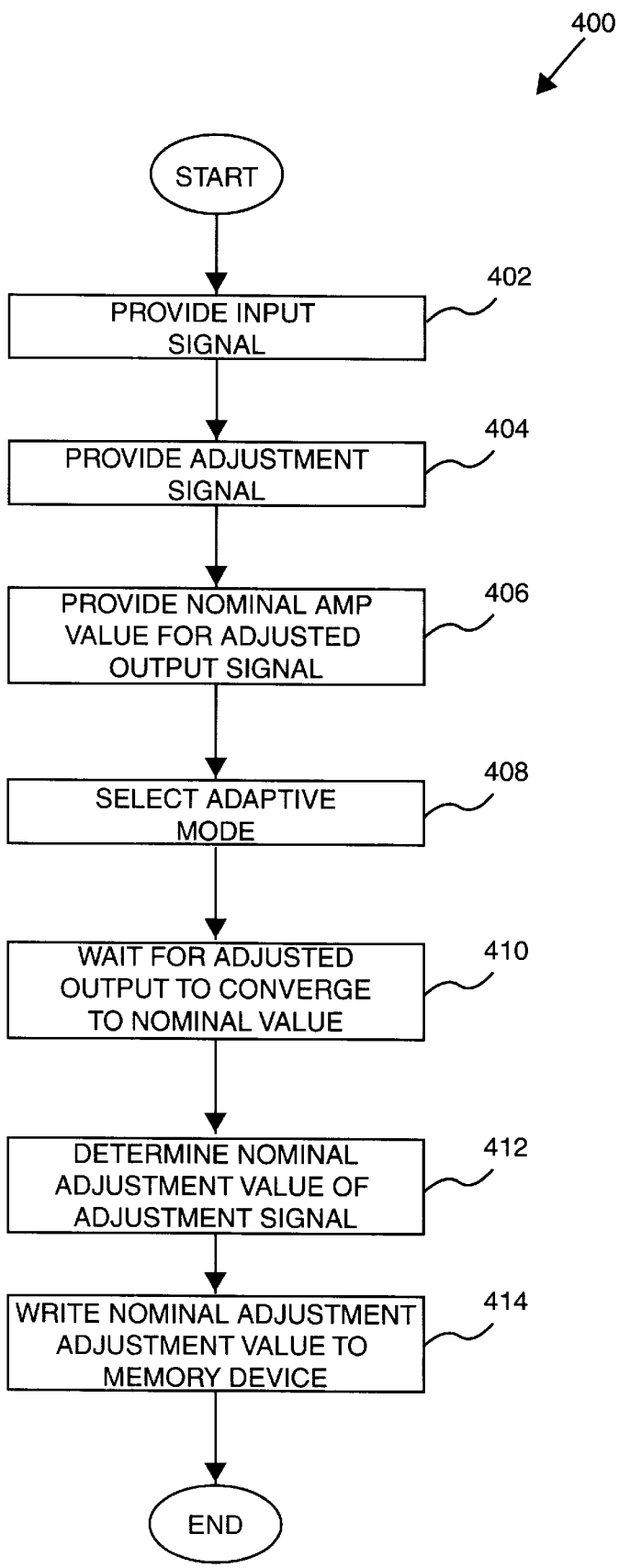
FIG. 4 is a flowchart illustrating the process of calibrating the line card of FIG. 3 in accordance with one embodiment of the present invention.

FIG. 4 is a flowchart illustrating the process 400 of calibrating the line card 24 of FIG. 3 in accordance with one embodiment of the present invention. The purpose of process 400 is to determine one or more nominal adjustment values and then store the nominal adjustment values within a memory device. Process 400 may be performed at any suitable time. For example, process 400 may be performed immediately after the line card is fabricated and prior to installation within a router.

The operations of process 400 will be described in reference to the line card 24 of FIG. 3. Initially, an input signal 122 is provided to gain control circuit 302 of the line card 24 in operation 402. The input signal 122 has a particular amplitude or power level. For example, the input signal may be −8, 0, or +8 dBmV. An adjustment signal 322 for controlling amplification of the input signal 122 is also provided to the gain control circuit 302 in operation 404. The adjustment signal 322 may be provided to the gain control circuit 302 in any suitable manner. For example, an adjustment value may be written into the adjustment value register 310. The adjustment value register 310 then provides the adjustment signal 322 based on the contents of the adjustment value register 310.

A nominal amplitude value that will be compared to the adjusted output signal 304 is then provided in operation 406. The nominal amplitude value may be provided in any suitable manner, such as writing to the nominal amplitude register 314. The adaptive mode is then selected in operation 408. The adaptive mode may be selected by using any suitable technique, such as writing a value that indicates adaptive mode to the fixed/adaptive mode register 314.

Operations 402 through 408 may be accomplished in any order. Additionally, although the present invention has been described in terms of writing to separate registers (e.g., adjustment value, fixed/adaptive mode, and nominal amplitude registers), of course, the configuration of the registers may vary. For example, the registers may be combined such that the adjustment value, fixed/adaptive mode, and nominal amplitude values may be set by one write instruction. Alternatively, a register may include other variables that are also set with each write to the particular register.

As described above, the gain control circuit 302 amplifies the input signal based on the adjustment signal 322. When the line card 24 is set into adaptive mode, the adjustment signal 322 is altered by the adjustment control block 308 based on whether the adjusted output signal 324 is higher or lower than the nominal amplitude 314. The altered adjustment signal is then used to adjust the amount of amplification of the input signal and output a new adjusted output signal 324 from the gain control circuit 302. The adjustment signal is repeatedly altered based on whether the adjusted output signal is too high or too low. After a predetermined amount of time, the adjusted output signal converges to an adjusted amplitude value that is substantially equal to the nominal amplitude.

In operation 410, process 400 waits for this convergence to occur. This wait may be accomplished in any suitable manner. For example, process 400 may wait for a predetermined amount of time that ensures that convergence has occurred. Alternatively, the adjustment value 310 may be periodically checked to determine whether it is tightly oscillating around a particular value, which indicates convergence.

After waiting for convergence to occur, a nominal adjustment value of the adjustment signal is determined in operation 412. The nominal adjustment value may be determined by simply reading the adjustment value from the adjustment value register 310. Alternatively, several readings of adjustment values may be taken and used to determine an average nominal adjustment value. The nominal adjustment value may then be substantially permanently stored in the memory device 316 of the line card 24 in operation 414.

Process 400 may be repeated for a plurality of input signals that have varying amplitude levels. A nominal adjustment value is determined for a particular input signal and stored in the memory device at an address that corresponds to the particular input signal's amplitude level. After process 400 is performed for a set of input signals, the memory device 316 of the line card 24 will contain a nominal adjustment value for each input signal.

Figure 5:
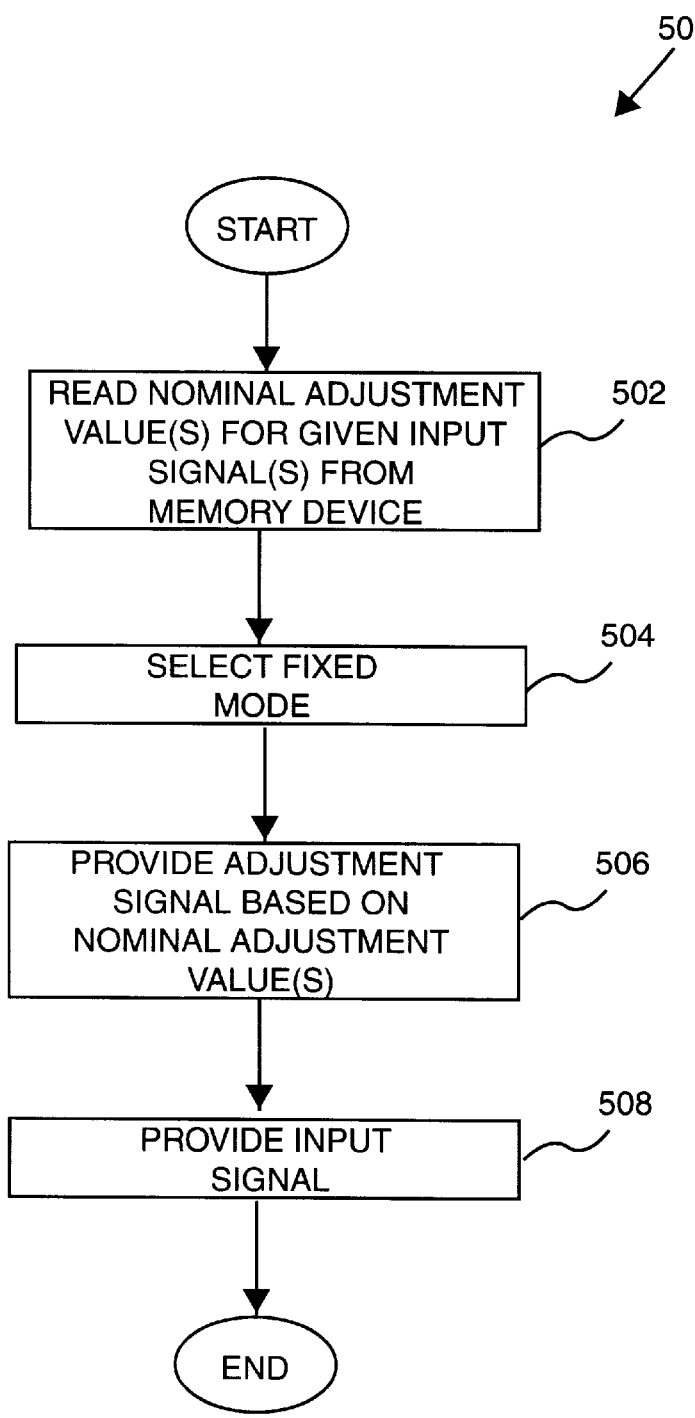
FIG. 5 is a flowchart illustrating the process of automatically providing an adjustment signal for the line card of FIG. 3 in accordance with one embodiment of the present invention.

FIG. 5 is a flowchart illustrating the process 500 of automatically providing an adjustment signal for the line card 24 of FIG. 3 in accordance with one embodiment of the present invention. Initially, one or more nominal adjustment values are read from the memory device 316 in operation 502. Next, the fixed mode is selected for the line card in operation 504. An adjustment signal is then provided for a particular input signal to the line card 24 based on the read nominal adjustment value(s) in operation 506, and the particular input signal is provided in operation 508.

As described above, the adjustment signal may be provided by writing an adjustment value to the adjustment value register 310. If a nominal adjustment value for the particular input signal's amplitude level is available within the memory device 316, it is only necessary to read the nominal adjustment value for the particular input signal's amplitude level. The nominal adjustment value may then be written directly into the adjustment value register 310 to provide the appropriate adjustment signal for the particular input signal. Alternatively, the line card may be arranged to read the input signal's amplitude and then automatically determine the correct adjustment value.

However, if the memory device 316 does not contain a nominal value for the particular input signal's amplitude level, a calculated nominal value for the particular amplitude level may be determined from two or more nominal values for other input signal amplitude levels. Preferably, nominal adjustment values have been stored for maximum and minimum amplitude levels. Since nominal adjustment values are linearly dependent on the input signal's amplitude level, the calculated adjustment value may be determined by interpolating between the maximum and minimum adjustment values. However if the minimum and maximum adjustment values are not provided, the calculated adjustment value may still be determined by extrapolation or interpolation depending on which nominal values are available.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. For example, the calibration operations have been described as being implemented within a router, however, the calibrations may be implemented within a router simulation environment that is configured to simulate a router. By way of another example, a range of nominal adjustment values may be determined for each input signal amplitude and line card. By way of a final example, several of the operations of the present invention may be implemented in hardware (such as a gate array device), instead of software, e.g., hardware components on the line card may function to store the determined nominal adjustment values in memory during calibration. Accordingly, the present embodiments are to be considered as illustrative and not restrictive, and the invention is not to be limited to the details given herein, but may be modified within the scope and equivalents of the appended claims.

What is claimed is:

1. A method for calibrating a line card having a gain control circuit, an adjustment control circuit, a comparator, and memory device, the gain control circuit being configured to receive an input signal and an adjustment signal and to output an adjusted output signal that is based on the input signal and the adjustment signal, the comparator being configured to compare the input signal to a nominal amplitude value and to output a comparison signal that indicates whether the input signal requires an adjustment, the adjustment control circuit being configured to alter the adjustment signal to a nominal adjustment value so that an adjusted amplitude value of the adjusted signal converges with the nominal amplitude value when the comparison signal indicates that the input signal requires adjustment, the method comprising the acts of:

providing a first input signal and a first adjustment signal to the gain control circuit so that the gain control circuit outputs an adjusted output signal;

providing a nominal amplitude value to the comparator so that the comparator outputs a first comparison signal that indicates whether the first input signal requires an adjustment;

determining a first nominal adjustment value based on the first comparison signal; and substantially permanently storing the first nominal adjustment value within a first address of the memory device, the first address being associated with the first input signal.

2. The method as recited in claim 1, wherein the first adjustment signal is provided by writing to an adjustment value resister on the line card.

3. The method as recited in claim 1, wherein the nominal amplitude value is provided by writing to a nominal amplitude value on the line card.

4. The method as recited in claim 2, wherein the first nominal adjustment value is determined by the acts of:

waiting for the adjusted output signal to converge with the nominal amplitude value; and reading the first nominal adjustment value from the adjustment value register on the line card.

5. The method as recited in claim 4, wherein the waiting is accomplished by waiting for a predetermined amount of time that is long enough to allow convergence of the adjusted output signal to the nominal amplitude value.

6. The method as recited in claim 4, wherein waiting further includes the acts of:
periodically checking a contents of the adjustment value register; and
determining when convergence has occurred by analyzing the contents of the adjustment register.

7. The method as recited in claim 6, wherein the contents are analyzed to determined whether the contents are substantially tightly oscillating around a particular adjustment value.

8. The method as recited in claim 1, further comprising the acts of:
providing a second input signal to the gain control circuit, wherein the comparator outputs a second comparison signal that indicates whether the second input signal requires an adjustment;
determining a second nominal adjustment value based on the second comparison signal; and
substantially permanently storing the second nominal adjustment value within a second address of the memory device, the second address being associated with the second input signal.

9. The method as recited in claim 1, wherein the memory device is a nonvolatile memory type.

10. The method as recited in claim 8, wherein the first and second nominal adjustment values are stored prior to installing the line card into a router.

11. The method as recited in claim 8, wherein the first input signal has a first amplitude value that is different than a second amplitude value of the second input signal.

12. The method as recited in claim 11, wherein the first amplitude value is a maximum amplitude value at which the line card may properly function.

13. The method as recited in claim 12 wherein the second amplitude value is a minimum amplitude value at which the line card may properly function.

14. A method for calibrating a line card having a gain control circuit and memory device, the gain control circuit being configured to receive an input signal and an adjustment signal and to output an adjusted output signal that is based on the input signal and the adjustment signal, the memory device having a plurality of nominal adjustment values that are each associated with a particular input signal, the method comprising the acts of:
retrieving a first nominal adjustment value that is associated with a first input signal the memory device; and
providing a first adjustment signal to the gain control circuit based on the first nominal adjustment value.

15. The method as recited in claim 14 further comprising the act of providing the first input signal to the gain control circuit.

16. The method as recited in claim 14, wherein the first nominal adjustment value is provided as the first adjustment signal.

17. The method as recited in claim 16, wherein the first nominal adjustment value is provided as the first adjustment signal by writing the first nominal adjustment value to an adjustment value register on the line card.

18. The method as recited in claim 15, wherein the gain control circuit is further configured to have a fixed mode for substantially maintaining the adjustment signal to provide a substantially fixed amplitude value for the adjusted output signal, further comprising the act of setting the gain control circuit into fixed mode such that a substantially fixed first adjusted output signal is provided based on the first input signal and first nominal adjustment value.

19. A method as recited in claim as recited in claim 14 further comprising the act of installing the line card within a router prior to retrieving the first nominal adjustment value.

20. A method as recited in claim 14 further comprising the acts of:
retrieving a second nominal adjustment value for a second input signal;
calculating a third nominal adjustment value for a third input signal based on the first and second nominal adjustment values; and
providing the calculated third nominal adjustment value as a third adjustment signal to the gain control circuit.

21. The method as recited in claim 20, wherein the third nominal adjustment value is provided as the adjustment signal by writing the third nominal adjustment value into an adjustment value register on the line card.

22. The method as recited in claim 20 further including the act of providing the third input signal to the gain control circuit.

23. The method as recited in claim 20, wherein the first input signal has a first amplitude that is different from a second amplitude of the second input signal that is different from a third amplitude of the third input signal.

24. The method as recited in claim 20, wherein the third nominal adjustment value is calculated by interpolating between the first and second nominal adjustment values based on a relative difference between the first, second, and third amplitudes.

25. The method as recited in claim 20, wherein the third nominal adjustment value is calculated by extrapolating from the first and second nominal adjustment values based on a relative difference between the first, second, and third amplitudes.

26. A computer readable medium containing program instructions for calibrating a line card having a gain control circuit, an adjustment control circuit, a comparator, and memory device, the gain control circuit being configured to receive an input signal and an adjustment signal and to output an adjusted output signal that is based on the input signal and the adjustment signal, the comparator being configured to compare the input signal to a nominal amplitude value and to output a comparison signal that indicates whether the input signal requires an adjustment, the adjustment control circuit being configured to alter the adjustment signal to a nominal adjustment value so that an adjusted amplitude value of the adjusted signal converges with the nominal amplitude value when the comparison signal indicates that the input signal requires adjustment, the computer readable medium comprising:
computer readable code for providing a first input signal and a first adjustment signal to the gain control circuit so that the gain control circuit outputs an adjusted output signal;
computer readable code for providing a nominal amplitude value to the comparator so that the comparator outputs a first comparison signal that indicates whether the first input signal requires an adjustment;
computer readable code for determining a first nominal adjustment value based on the first comparison signal;
computer readable code for substantially permanently storing the first nominal adjustment value within a first address of the memory device, the first address being associated with the first input signal; and
a computer readable medium that stores the computer codes.

27. A computer system for calibrating a line card having a gain control circuit, an adjustment control circuit, a comparator, and memory device, the gain control circuit being configured to receive an input signal and an adjustment signal and to output an adjusted output signal that is based on the input signal and the adjustment signal, the comparator being configured to compare the input signal to a nominal amplitude value and to output a comparison signal that indicates whether the input signal requires an adjustment, the adjustment control circuit being configured to alter the adjustment signal to a nominal adjustment value so that an adjusted amplitude value of the adjusted signal converges with the nominal amplitude value when the comparison signal indicates that the input signal requires adjustment, the computer system comprising:

an initializer mechanism arranged to provide a first input signal and a first adjustment signal to the gain control circuit and a nominal amplitude value to the comparator so that the comparator outputs a comparison signal that indicates whether the first input signal requires an adjustment; and a determination mechanism arranged to determine a first nominal adjustment value based on the comparison signal and to substantially permanently store the first nominal adjustment value within a first address of the memory device, the first address being associated with the first input signal.

28. A computer readable medium containing program instructions for calibrating a line card having a gain control circuit and memory device, the gain control circuit being configured to receive an input signal and an adjustment signal and to output an adjusted output signal that is based on the input signal and the adjustment signal, the memory device having a plurality of nominal adjustment values that are each associated with a particular input signal, the computer readable medium comprising:

computer readable code for retrieving a first nominal adjustment value that is associated with a first input signal the memory device;

computer readable code for providing a first adjustment signal to the gain control circuit based on the first nominal adjustment value; and a computer readable medium that stores the computer codes.

29. A computer system for calibrating a line card having a gain control circuit and memory device, the gain control circuit being configured to receive an input signal and an adjustment signal and to output an adjusted output signal that is based on the input signal and the adjustment signal, the memory device having a plurality of nominal adjustment values that are each associated with a particular input signal, the computer system comprising:

an extracting mechanism for retrieving a first nominal adjustment value that is associated with a first input signal the memory device; and an analyzing mechanism for providing a first adjustment signal to the gain control circuit based on the first nominal adjustment value.

* * * * *